United States Patent
Chan

(10) Patent No.: US 10,862,427 B1
(45) Date of Patent: Dec. 8, 2020

(54) ADVANCED MULTI-GAIN CALIBRATION FOR DIRECT MODULATION SYNTHESIZER

(71) Applicant: Hong Kong Applied Science and Technology Research Institute Company, Limited, Hong Kong (HK)

(72) Inventor: Tat Fu Chan, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 0 days.

(21) Appl. No.: 16/857,804

(22) Filed: Apr. 24, 2020

(51) Int. Cl.

| H03L 7/08 | (2006.01) |
|---|---|
| H03L 7/099 | (2006.01) |
| H03L 7/14 | (2006.01) |
| H03C 3/09 | (2006.01) |
| H03L 7/189 | (2006.01) |
| H03L 7/197 | (2006.01) |
| H03L 7/093 | (2006.01) |
| H03L 7/089 | (2006.01) |

(52) U.S. Cl.
CPC ......... *H03C 3/0991* (2013.01); *H03C 3/0925* (2013.01); *H03C 3/0933* (2013.01); *H03C 3/0958* (2013.01); *H03C 3/0966* (2013.01); *H03L 7/0891* (2013.01); *H03L 7/093* (2013.01); *H03L 7/0992* (2013.01); *H03L 7/189* (2013.01); *H03L 7/1976* (2013.01)

(58) Field of Classification Search
CPC combination set(s) only.
See application file for complete search history.

(56) References Cited

U.S. PATENT DOCUMENTS

| 7,098,824 | B2 | 8/2006 | Yang et al. | |
| 7,375,595 | B2* | 5/2008 | Serrano | H03L 7/0898 |
| | | | | 331/16 |
| 7,474,159 | B2* | 1/2009 | Wang | H03L 7/099 |
| | | | | 331/16 |
| 7,755,439 | B2 | 7/2010 | Yu et al. | |
| 8,022,782 | B2 | 9/2011 | Ahn | |
| 9,935,640 | B1* | 4/2018 | Chan | H03C 3/0925 |
| 9,954,543 | B1 | 4/2018 | Chan et al. | |
| 2018/0097521 | A1 | 4/2018 | Hammerschmidt | |

\* cited by examiner

*Primary Examiner* — An T Luu
(74) *Attorney, Agent, or Firm* — Stuart T. Auvinen; gPatent LLC

(57) ABSTRACT

A two-point modulation Phase-Locked Loop (PLL) has a dual-input Voltage-Controlled Oscillator (VCO). A digital data modulation signal is combined with a carrier and input to a feedback divider. The data modulation signal is also input to an offset Digital-to-Analog Converter (DAC) to generate an analog voltage to a second input of the VCO. The loop path through the VCO has a higher gain than the DAC path through the VCO, which has better linearity. A calibration unit divides the VCO output and counts pulses. The offset DAC has a data input and a gain input. During calibration, the data input of the DAC is set to minimum and then maximum values and VCO output pulses counted, and repeated for two values of the gain input to the DAC. From the four counts a K(DAC) calculator calculates the calibrated gain to apply to the gain input of the offset DAC.

20 Claims, 9 Drawing Sheets

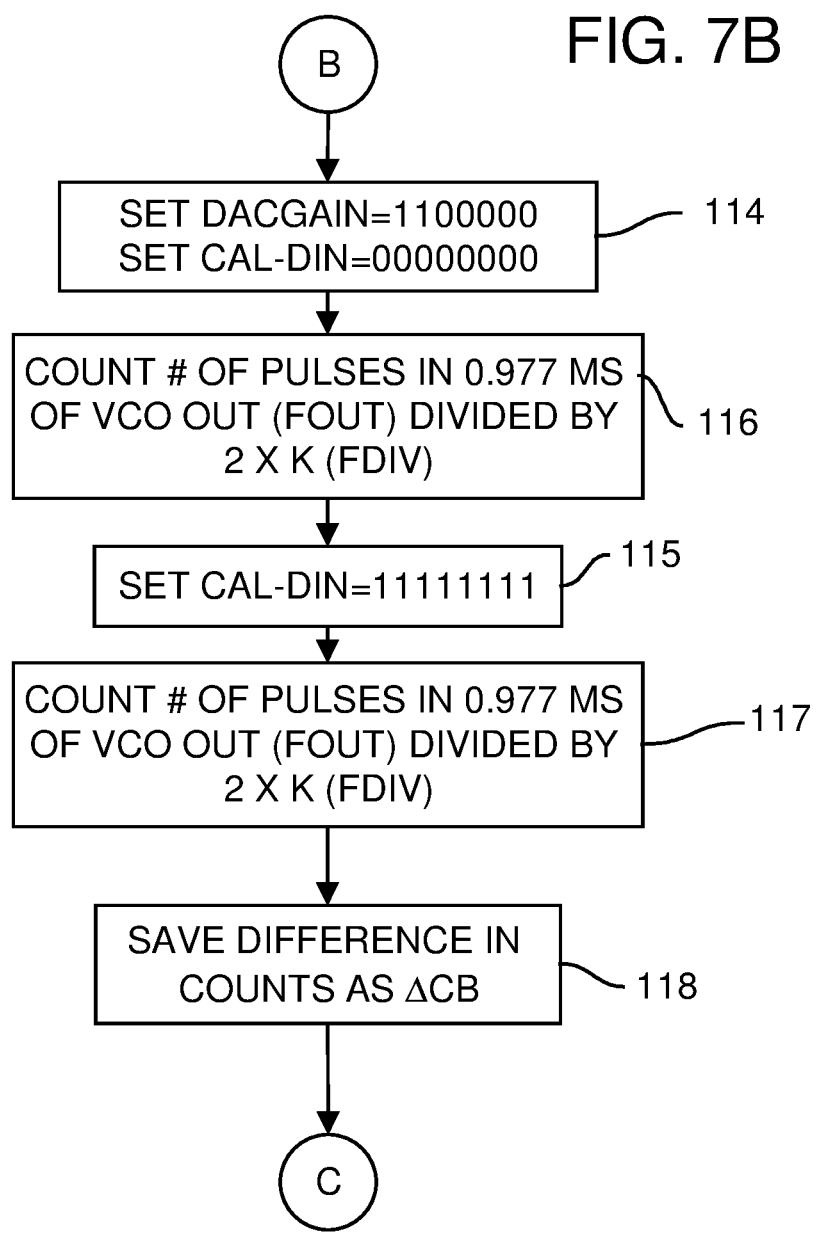

ADVANCED MULTI-GAIN CALIBRATION FOR DIRECT MODULATION SYNTHESIZER

FIELD OF THE INVENTION

This invention relates to Phase-Locked Loops (PLL's), and more particularly to gain calibration of a Voltage-Controlled Oscillator (VCO) using two gain values.

BACKGROUND OF THE INVENTION

Advanced wireless communication systems require precise clocks that are modulated to carry data. A clock may be generated using a Phase-Locked Loop (PLL) that has a voltage-controlled oscillator (VCO) that converts an input voltage to an output clock with a frequency that depends on the input voltage.

Some communication standards employ high frequencies and may hop from one frequency channel to another to avoid interference or other impediments to transmission. The VCO may thus be required to operate over a wide range of frequencies, and require a large gain. Large VCO gains often require a large chip area and thus a higher cost of manufacture and power.

A PLL can be used to generate a clock, and then data can be mixed with the clock after the PLL output, such as by an up-conversion mixer and a Digital-to-Analog Converter (DAC). However, the DAC can introduce mismatches for both in-phase and quadrature signals (IQ mismatch). The chip area required for the DAC and mixer increases the cost and power requirements.

A two-point modulation PLL may also be used. Data is injected into the PLL itself so that the PLL outputs a data-modulated output rather than a fixed clock. The up-conversion mixer and its DAC are no longer required when a two-point modulation PLL is used. The two-point modulation PLL also can enhance noise performance. The pulling effect from a power amplifier to the VCO can be alleviated.

FIG. 1 shows a prior-art two-point modulation PLL. A Phase-Locked Loop (PLL) is formed by phase-frequency detector 42, charge pump 44, loop filter 46, adder 72, VCO 41, and multi-mode divider 52. The output clock FOUT from VCO 41 is divided by multi-mode divider 52 and compared to a reference clock FREF by phase-frequency detector 42. The comparison result causes charge pump 44 to charge or discharge loop filter 46, which adjusts the input voltage to VCO 41. VCO 41 responds to changes in its input voltage by adjusting the frequency of output clock FOUT.

Data is used to modulate or encode FOUT from VCO 41. Data is injected into the PLL at two points. Data IN1 is applied to multi-mode divider 52, while data IN2 is input to adder 72. The same data values are applied to IN1 and IN2, but IN1 may be a digital representation of the data while IN2 may be an analog voltage that represents the same data. IN1 causes multi-mode divider 52 to modulate its divisor, while IN2 directly adjusts the input voltage to VCO 41. Since IN2 is applied at the input of VCO 41, it has a high-pass characteristic, while IN1 is applied earlier in the PLL loop and has a low-pass characteristic. Modulations of the divisor in multi-mode divider 52 introduced by IN1 must pass through phase-frequency detector 42, charge pump 44, and loop filter 46 before reaching adder 72 where IN2 is injected, so IN1 has a greater inherent delay than does IN2.

FIGS. 2A-C show frequency response graphs that highlight gain mismatching in a two-point modulation PLL. Since IN2 does not pass through phase-frequency detector 42, charge pump 44, and loop filter 46, its frequency response is dominated by the gain of VCO 41.

FIG. 2A shows a graph for a well-matched two-point modulation PLL. The frequency response of IN1 drops off at higher frequencies due to the delays in multi-mode divider 52, phase-frequency detector 42, charge pump 44, and loop filter 46. These delays are not present for IN2, which has a very good response at high frequencies but less at low frequencies. Thus IN1 resembles a low-pass filter, while IN2 resembles a high-pass filter.

Since the same data is passed through both IN1 and IN2, the total frequency response is the sum of the frequency response curves of IN1 and IN2. This total response is relatively flat over all frequencies when gain is well-matched, as shown in FIG. 2A.

In FIG. 2B, the VCO gain, $K_{VCO}$, is too high. The high gain of VCO 41 strongly impacts the high-frequency response of IN2, while IN1 remains about the same since multi-mode divider 52, phase-frequency detector 42, charge pump 44, and loop filter 46 are not altered by the change in gain of VCO 41. The total frequency response, which is the sum of IN1 and IN2's frequency response curves, rises after cross-over frequency FC. The jump in the total response curve at high frequencies can cause signal distortion.

In FIG. 2C, the VCO gain, $K_{VCO}$, is too low. The low gain of VCO 41 reduces the high-frequency response of IN2, while IN1 remains about the same. The total frequency response drops off after cross-over frequency FC, since high-frequency response is dominated by data injected through IN2 and VCO 41.

The gain of VCO 41 is process-dependent, and varies from chip to chip. Process, power-supply Voltage, and Temperature (PVT) variations can strongly influence VCO gain and thus frequency response, resulting in signal distortion. During the design phase, the circuit can be designed so that the low-frequency response of IN1 matches the high-frequency response of IN2 at the typical PVT condition.

Gain calibration is often used to adjust for PVT conditions, and to better match high and low frequency responses of a two-point modulation PLL. With good calibration of the gain of VCO 41, the low-frequency response of IN1 can fairly well match the high-frequency response of IN2 over a range of PVT conditions.

Sometimes large-area circuits are used for calibration, such as ADC's, analog comparators, and double-loop filters. High-frequency counters may be used, but these consume high power at the high frequencies they operate at. A single-input VCO has limitations on linearity and tuning range. Calibration units often use multipliers and dividers, which are large, complex circuits. Large circuits have a large die area, increasing cost and power consumption and are thus undesirable. Precision circuits such as analog comparators and ADC's may require large components to achieve a target precision.

As the system warms up, PVT may continue to vary, forcing re-calibration and more delays. Some systems are closed loop, where the PLL loop filter remains connected to the VCO input during calibration. This is undesirable due to the extra settling time for the loop. Open loop systems disconnect the PLL loop filter from the VCO input during calibration, resulting in faster calibration times.

The DAC used in VCO calibration can be difficult to implement when high accuracy is required. Sometimes a DAC of more than 10 bits is required. These DACs with more than 10-bit resolution are expensive and tricky to implement. Therefore it is desired to reduce the size of a DAC used for calibration.

What is desired is a two-point modulation PLL with an open-loop calibration system. A calibration system that does not use precision analog comparators is desirable. An all-digital calibration unit is desired for a two-point modulation PLL. A two-point modulation PLL that uses a two-input VCO is desirable to break the tradeoff between linearity and tuning range. A calibration unit that does not use multipliers and dividers is desired. A low-power and low area calibration unit is desired.

BRIEF DESCRIPTION OF THE DRAWINGS

FIGS. 7A-7C show a flowchart of two-gain-point calibration of the two-point modulation PLL of FIG. 3.

DETAILED DESCRIPTION

The present invention relates to an improvement in gain calibration for PLL's. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
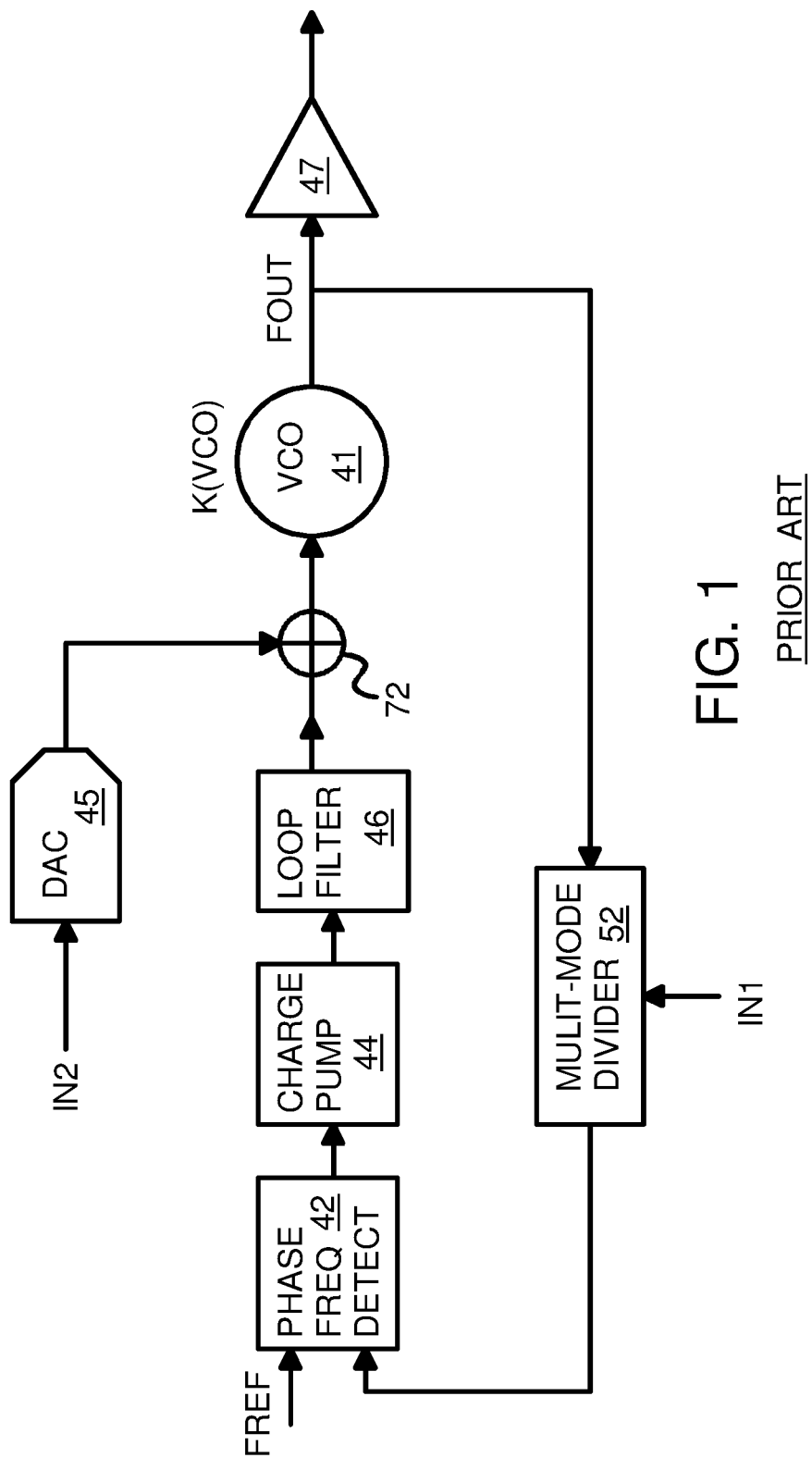
FIG. 1 shows a prior-art two-point modulation PLL.
Figure 2:
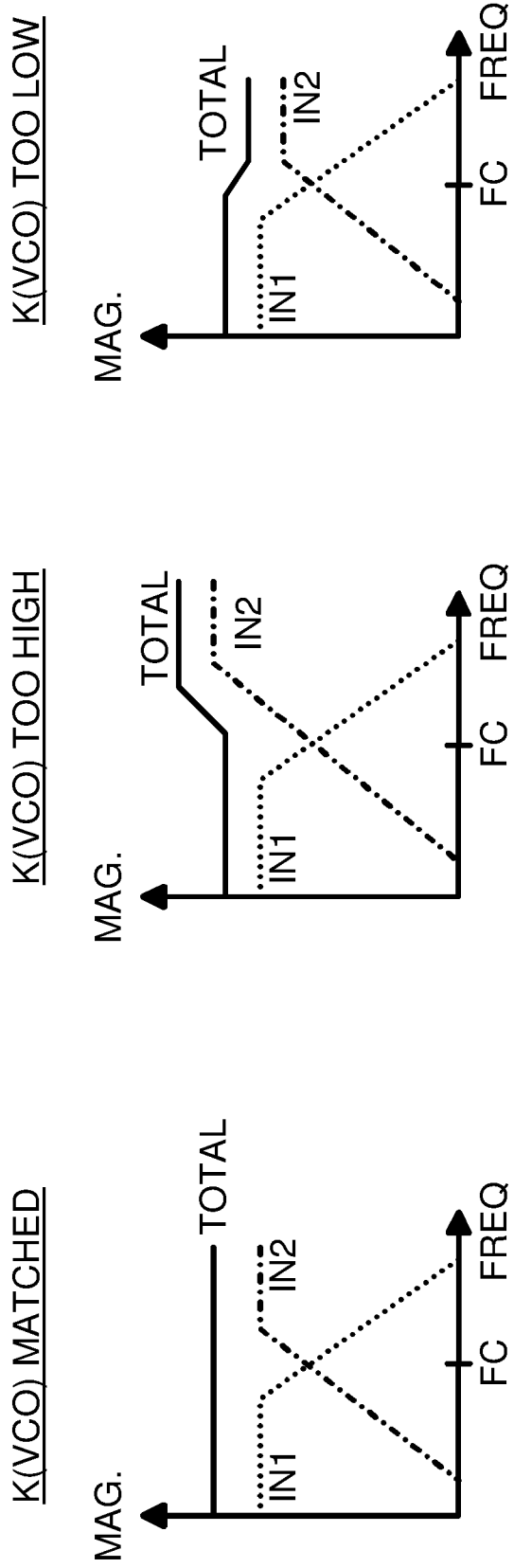
FIGS. 2A-C show frequency response graphs that highlight gain mismatching in a two-point modulation PLL.
Figure 3:
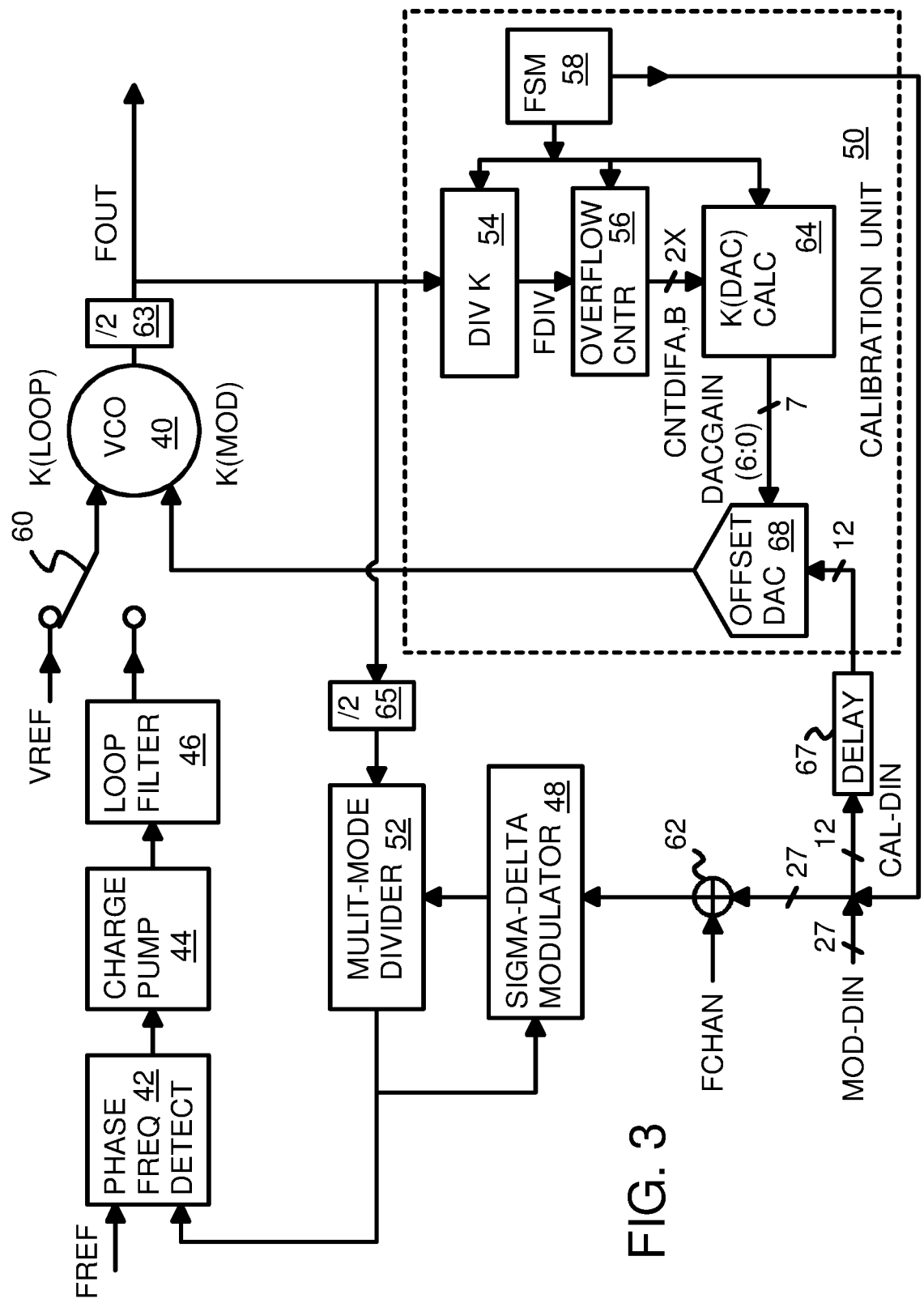
FIG. 3 is block diagram of a two-point modulation PLL using an overflow counter and an offset DAC to calibrate VCO gain using two gain values.

FIG. 3 is block diagram of a two-point modulation PLL using an overflow counter and an offset DAC to calibrate VCO gain using two gain values. Rather than use an expensive, high-precision DAC, the inventor uses an offset DAC that has a variable gain. The DAC gain is set to 2 different values during calibration. Rather than perform calibration at a single value of gain, the inventor performs calibration twice, at two different values of gain. The VCO has two different gain values, $K_{LOOP}$ for the PLL loop path through charge pump 44, and $K_{MOD}$ for the high-pass modulations through offset DAC 68. The PLL loop path has a much higher gain than the modulation path through offset DAC 68, so $K_{LOOP}$ is much greater than $K_{MOD}$. Having two different gains, $K_{LOOP}$ and $K_{MOD}$, relaxes the trade-off between phase noise and linearity. Linearity is improved by using a lower gain for the modulation path in VCO 40 from offset DAC 68, while phase noise immunity is improved by the higher gain in the PLL path in VCO 40 from phase-frequency detector 42, charge pump 44, loop filter 46.

Rather than use analog comparators, during calibration overflow counter 56 counts pulses of VCO output FOUT. To reduce power consumption, FOUT is first divided by K by divider 54 before overflow counter 56 is clocked. The difference in pulse counts for a given period of time (CNT-DIF) is input to K(DAC) calculator 64, which then outputs a digital value DACGAIN(6:0). DACGAIN(6:0) is the gain control for offset DAC 68. Offset DAC 68 converts digital data MOD to an analog signal that is applied to the gain-control input of VCO 40. Calibration unit 50 also includes a controller such as Finite State Machine (FSM) 58 to control calibration operations, such as shown later in FIGS. 7A-C.

A Phase-Locked Loop (PLL) is formed by phase-frequency detector 42, charge pump 44, loop filter 46, switch 60, VCO 40, and multi-mode divider 52. Additional dividers 63, 65 are added to the loop to further divide by 2. The output clock FOUT from VCO 40 and divider 63 is divided again by divider 65 and then by multi-mode divider 52. The output of multi-mode divider 52 is compared to a reference clock FREF by phase-frequency detector 42. The comparison result causes charge pump 44 to charge or discharge loop filter 46, which adjusts the $K_{LOOP}$ input voltage to VCO 40. VCO 40 responds to changes in its $K_{LOOP}$ input voltage by adjusting the frequency of output clock FOUT.

The specified frequency FCS that the transceiver is using is indicated by FCHAN. FCHAN can be a carrier wave for the specified frequency FCS that is applied to adder 62 to be modulated by MOD-DIN and then the modulated carrier is applied to sigma-delta modulator 48. Sigma-delta modulator 48 generates a signal that dithers the divisor used by multi-mode divider 52 so that fractional divisor values may be achieved although multi-mode divider 52 is using integer divisors. Integer divisors such as N and N+1 can be averaged over several cycles to achieve a desired fractional divisor, and allow a more arbitrary value of FOUT to be generated from FREF. The PLL loop smoothes out the resulting variations as two integer divisor values are alternated by sigma-delta modulator 48 and multi-mode divider 52.

When a new frequency is specified, FCHAN changes to the new frequency's carrier and may cause multi-mode divider 52 to change its divisors, and sigma-delta modulator 48 to change its dithering periods.

Two-point modulation is provided by modulation data MOD-DIN, which is injected into the PLL loop at two points, multi-mode divider 52 and VCO 40. A 27-bit modulation value MOD-DIN is added to the frequency carrier wave FCHAN by adder 62, and then dithered by Sigma-delta modulator 48 and injected into the loop by multi-mode divider 52.

The 12 Most-Significant Bits (MSBs) of the 27-bit data MOD-DIN are delayed by delay 67 and converted to an analog voltage by offset DAC 68 and then input to the gain-control input of VCO 40. The gain-control $K_{MOD}$ input of VCO 40 can adjust a delay element such as a variable capacitor on an internal node in VCO 40, or can adjust a power-supply voltage for internal stages within VCO 40. The gain-control input to VCO 40 has a lower gain and better linearity while the loop input from loop filter 46 and switch 60 to VCO 40 has a higher gain but worse linearity.

Offset DAC 68 has a 12-bit data input that receives modulated digital data MOD-DIN, and a 7-bit gain input that receives DACGAIN(6:0) from K(DAC) calculator 64. The gain input of offset DAC 68 scales the output voltage of offset DAC 68. DACGAIN(6:0) thus defines the maximum swings of the output voltage of offset DAC 68. The 12-bit data input that receives MOD-DIN is converted from digital to an analog voltage, while the gain input scales the analog voltage.

When DACGAIN(6:0) is at it lowest setting of 0000000, the gain of offset DAC 68 is greater than zero. Thus offset DAC 86 has a gain offset so that its gain is never at zero gain, so that offset DAC 68 always modulates the MOD-DIN input signal. If the gain of offset DAC 68 were to drop to zero, then the modulations of the MOD-DIN input signal would be destroyed, preventing these modulations from reaching VCO 40. Having a non-zero gain offset in offset DAC 68 prevents this modulation elimination problem.

During calibration, switch 60 connects the $K_{LOOP}$ voltage input to VCO 40 to reference voltage VREF. The connection from loop filter 46 is broken by switch 60 during calibration mode. Thus calibration is performed in an open-loop configuration. The open-loop configuration is desirable since calibration settling time does not depend on long delays through the entire PLL loop.

Calibration unit 50 measures the frequency of FOUT by counting pulses. Divider 54 divides FOUT by K, where K is a real number of at least 1. The divided-by-K output of divider 54 is slower than FOUT, allowing overflow counter 56 to operate more slowly and with less power. An all-digital counter has a lower area, power consumption, and cost than an analog comparator, and is less susceptible to process variations.

Finite State Machine (FSM) 58 controls the sequence of operations during calibration mode. During calibration, FSM 58 initially sets DACGAIN to a one-quarter value such as 0100000 so that offset DAC 68 has a value of ¼ $K_{DAC(MAX)}$.

MOD-DIN is disabled and instead driven by FSM 50 in calibration unit 50 as calibration data CAL-DIN. Then FSM 58 causes CAL-DIN to be set high to 1111 1111, (CAL-DIN=FF), which passes through offset DAC 68 to control the $K_{MOD}$ gain of VCO 40. FSM 58 reads the count value from overflow counter 56 after a 0.977 millisecond (ms) period has elapsed and stores this value. Then FSM 58 causes CAL-DIN to be set low to 0000 0000, (CAL-DIN=00), which again passes through offset DAC 68 to control the $K_{MOD}$ gain of VCO 40. FSM 58 reads the count value from overflow counter 56 after a 0.977 ms period has elapsed and stores this value. The difference in the CAL-DIN=FF and CAL-DIN=00 counts is CNTDIF_A. FSM 58 inputs CNTDIF_A to K(DAC) calculator 64.

Next FSM 58 sets DACGAIN to a three-quarters value such as 1100000 so that offset DAC 68 has a value of ¾ $K_{DAC(MAX)}$. Then the calibration is repeated to obtain CNTDIF_B.

FSM 58 causes CAL-DIN to be set high to 1111 1111, (CAL-DIN=FF). FSM 58 reads the count value from overflow counter 56 after a 0.977 millisecond (ms) period has elapsed and stores this value. Then FSM 58 causes CAL-DIN to be set low to 0000 0000, (CAL-DIN=00), which again passes through offset DAC 68 to control the $K_{MOD}$ gain of VCO 40. FSM 58 reads the count value from overflow counter 56 after a 0.977 ms period has elapsed and stores this value. The difference in the CAL-DIN=FF and CAL-DIN=00 counts when set at ¾ $K_{DAC}$ is CNTDIF_B. FSM 58 inputs CNTDIF_B to K(DAC) calculator 64.

K(DAC) calculator 64 receives the 2 count difference values, CNTDIF_A generated at ¼ $K_{DAC(MAX)}$, and CNTDIF_B generated at ¾ $K_{DAC(MAX)}$. K(DAC) calculator 64 can directly calculate a calibration value for $K_{DAC}$, $K_{DAC(CAL)}$, from CNTDIF_A and CNTDIF_B, using a shift register and a divider, when various parameters are properly selected, as described later. Thus K(DAC) calculator 64 can use simplified logic to generate the calibration value for $K_{DAC}$, $K_{DAC(CAL)}$, from the two count differences CNTDIF_A, CNTDIF_B.

The calibration value for $K_{DAC}$, $K_{DAC(CAL)}$, is the setting DACGAIN(6:0) that is applied to offset DAC 68. K(DAC) calculator 64 converts the two count differences for the two 0.977 ms period directly into the gain adjustment value DACGAIN(6:0). When properly selected parameters are used, no complex arithmetic-logic-unit (ALU) is needed. Division by 2 can be performed by a shift register, and one divider is used.

Once calibration ends, DACGAIN(6:0) set to $K_{DAC(CAL)}$ is applied to offset DAC 68 to adjust the gain in the modulation path of MOD-DIN to the $K_{MOD}$ input of VCO 40. Switch 60 is closed to connect loop filter 46 to VCO 40, allowing normal closed-loop PLL operation to occur. Data modulation can resume on MOD-DIN.

Figure 4:
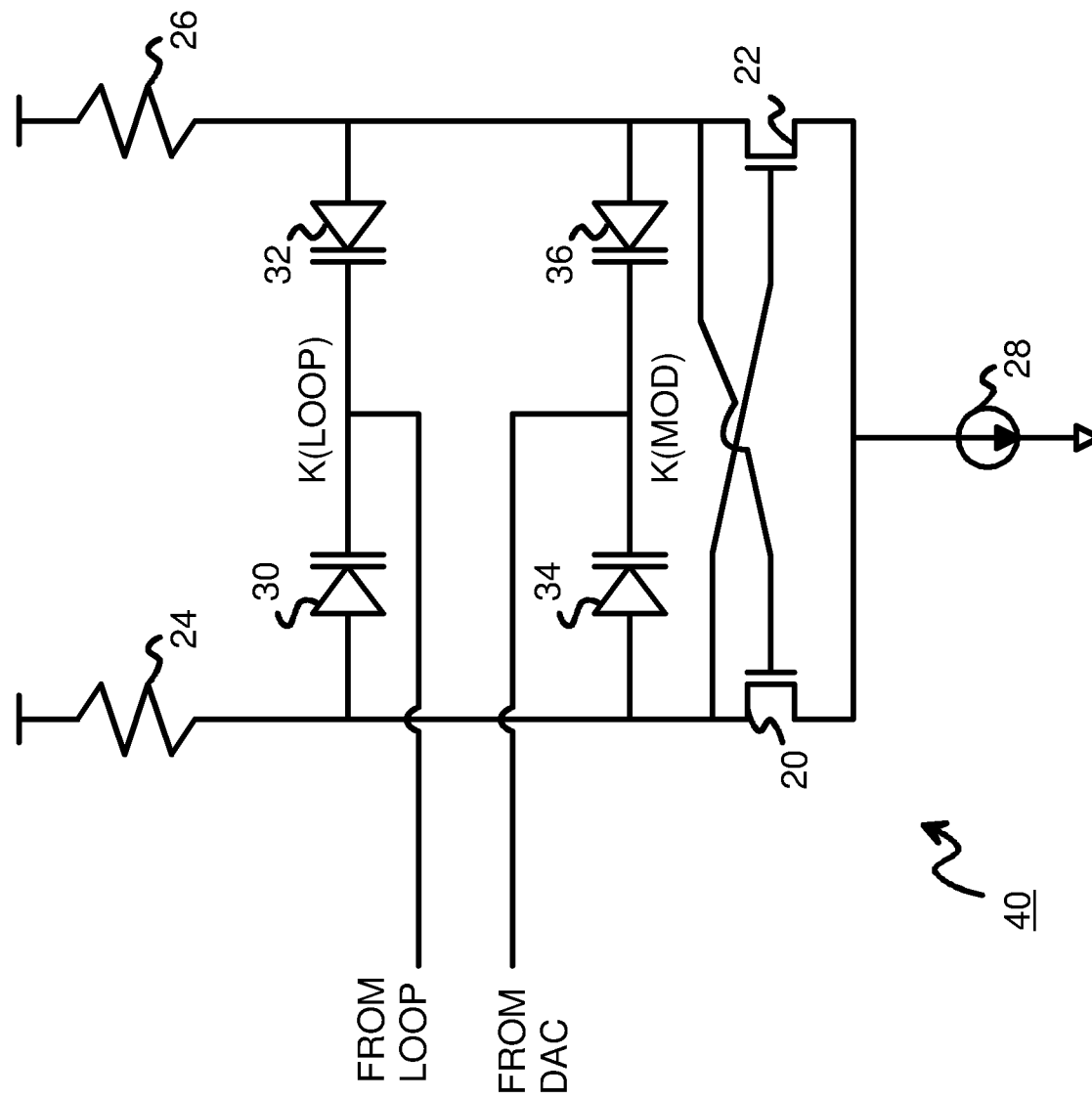
FIG. 4 is a schematic diagram of a dual-input VCO.

FIG. 4 is a schematic diagram of a dual-input VCO. VCO 40 is a differential amplifier with cross-coupled gates for n-channel transistors 20, 22 that have their sources connected together and to current sink 28. Pull-up resistors 24, 26 supply current to the drains of n-channel transistors 20, 22. Since n-channel transistors 20, 22 are cross-coupled, they will oscillate. VCO 40 is bistable.

The frequency of oscillation depends on the RC delays, specifically the delay through resistor 24 to charge capacitances on the drain of transistor 20, such as varactors 30, 34. This delay is typically matched to the delay through resistor 26 to charge capacitances on the drain of transistor 22, such as varactors 32, 36.

Varactors 30, 32 act as variable capacitors, where the capacitance is controlled by the LOOP input to VCO 40, which has a gain of $K_{LOOP}$. Likewise, varactors 34, 36 act as variable capacitors, where the capacitance is controlled by the MOD input to VCO 40, which has a gain of $K_{MOD}$.

The size of varactors 30, 32 can be larger than varactors 34, 36, so that $K_{LOOP}$ is larger than $K_{MOD}$. Varactors 30, 32, 34, 36 are reverse biased so that current does not flow through them.

Figure 5:
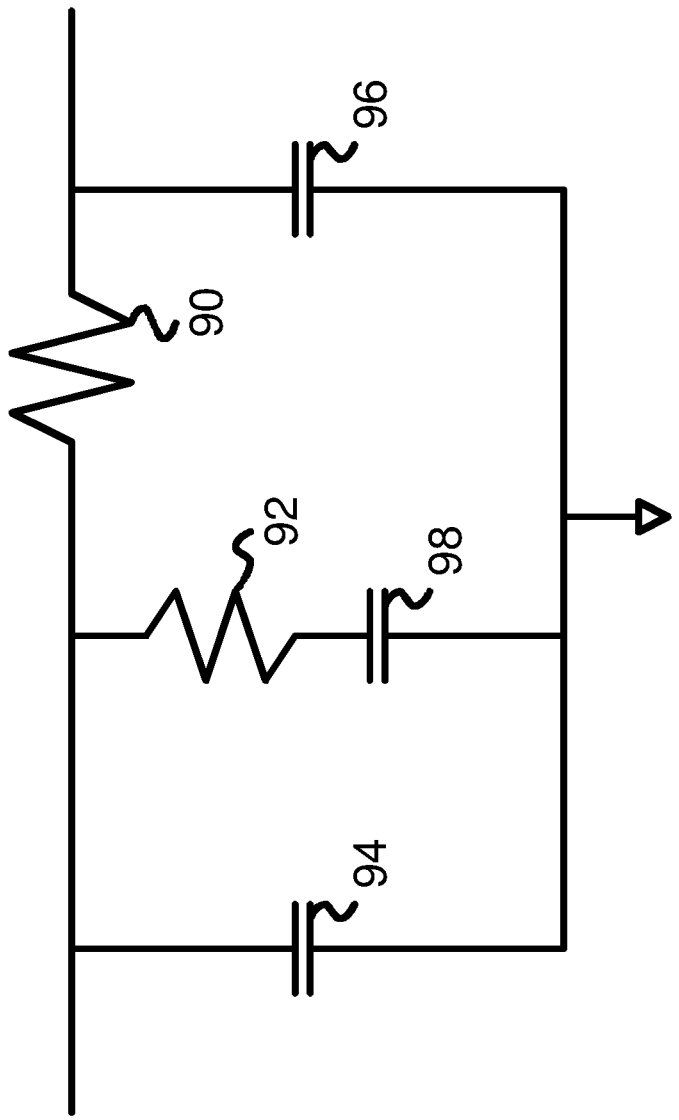
FIG. 5 shows a loop filter.

FIG. 5 shows a loop filter. Loop filter 46 can be implemented in a variety of ways, such as a simple series resistor and capacitor to ground, or in more complex networks. FIG. 5 shows a more complex embodiment of loop filter 46.

Charge is stored on both sides of series resistor 90, by capacitors 94, 96 on the input and output of loop filter 46. Charge from the input node is also stored on capacitor 98 through resistor 98. Charging and discharging of loop filter 46 is enhanced by having three capacitors to store charge on three different network nodes. Such a third-order loop filter for an analog PLL has better noise and spur compression than lower-order networks.

Figure 6:
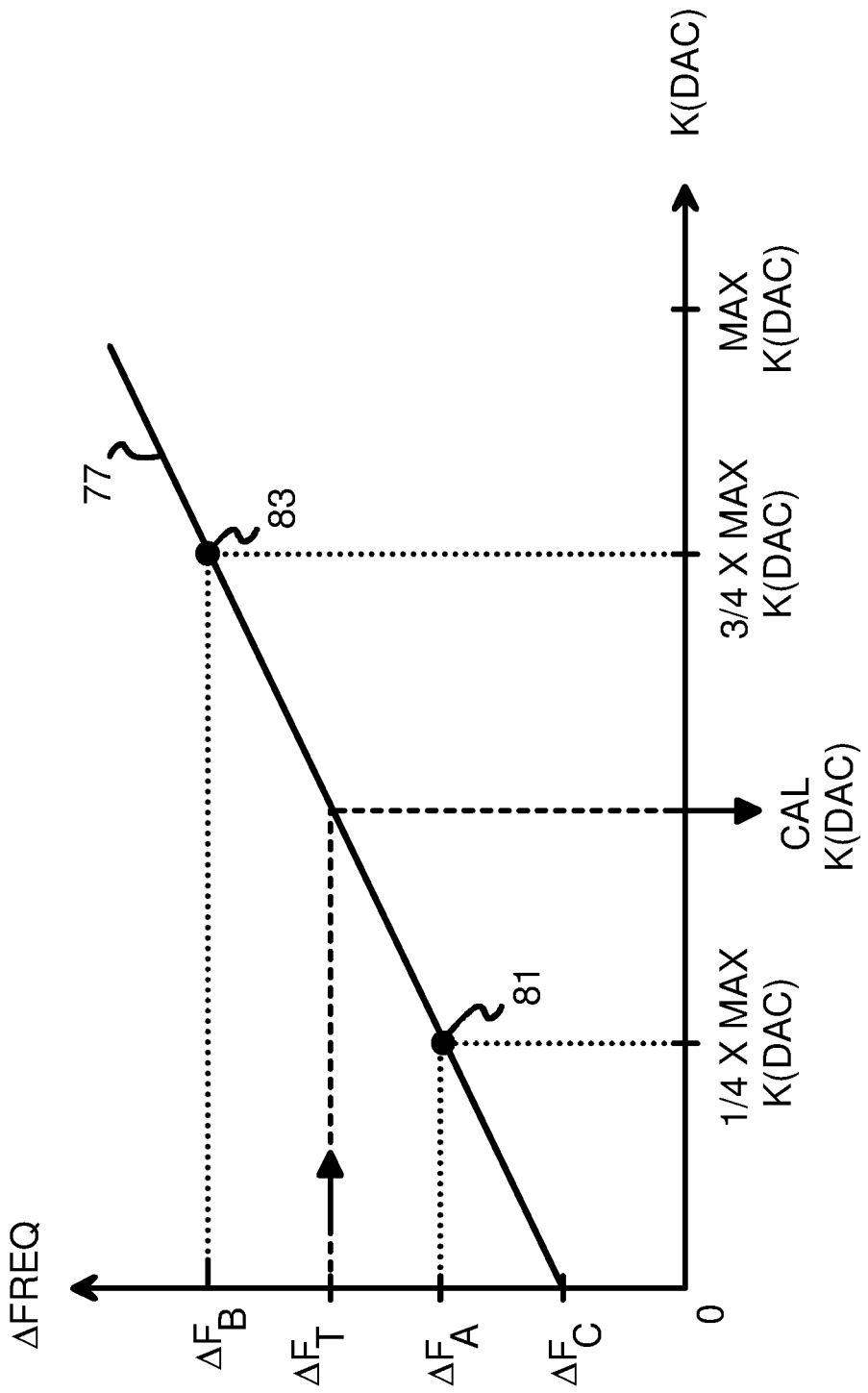
FIG. 6 is a graph highlighting 2-gain-point calibration.

FIG. 6 is a graph highlighting 2-gain-point calibration. The difference in frequency ΔFREQ is plotted as a function of the gain of offset DAC 68, $K_{DAC}$.

The difference in frequency ΔFREQ is the VCO output frequency FOUT, over the full range of the DAC inputs, from 00 to FF. The VCO frequency is measured by setting CAL-DIN to 0000 0000 and then measured again when CAL-DIN is set to 1111 1111.

This ΔFREQ is a function of the gain of offset DAC 68, $K_{DAC}$. Higher DAC gains have a larger frequency difference over the range of the DAC inputs. Line 77 shows the relationship between ΔFREQ and $K_{DAC}$. Line 77 varies with PVT, and calibration finds the slope and y-intercept of line 77, so that a value of $K_{DAC}$ can be selected to produce a desired target $\Delta F_T$ for a specified frequency range or band. This value if $K_{DAC}$ that produces the target $\Delta F_T$ is the calibrated gain value, $K_{DAC(CAL)}$.

Calibration is repeated for two different values of DAC gain. At first point 81, the DAC gain is set to ¼ $K_{DAC(MAX)}$, and the difference in pulse counts (ΔCA or CNTDIF_A) measured in calibration determines the frequency difference $\Delta F_A$. At second point 83, the DAC gain is set to ¾ $K_{DAC(MAX)}$, and the difference in pulse counts (ΔCB or CNTDIF_B) measured in calibration determines the frequency difference $\Delta F_B$. From these two points 81, 83, the slope and y-intercept ($\Delta F_C$) of line 77 can be determined.

Points 81, 83 are the two gain points for two-gain-point calibration. At each point 81, 83 the frequency (pulse count) is measured for two different values of the DAC data input CAL-DIN for one value of the gain input DACGAIN. Thus a total of four measurements are taken for the two-gain-point calibration.

The graph of FIG. 6 could be re-drawn with the DAC settings DACGAIN(6:0) replacing $K_{DAC}$ on the x-axis, and the pulse-count difference $\Delta C$ replacing the y-axis.

Two-Gain-Point Calibration Theory

The two-point modulation PLL can be designed so that the low-frequency response of IN1 matches the high-frequency response of IN2 at the typical PVT condition. Then gain calibration may be added to adjust the gain of VCO 40 for current PVT conditions. Rather than adjust the gain $K_{MOD}$ of VCO 40 directly, the gain $K_{DAC}$ of offset DAC 68 is adjusted, since the overall gain of the modulation path is the product $$K_{MOD} * K_{DAC}$$

In particular, a communication protocol or specification may specify what the maximum frequency deviation is for the maximum change in the modulation data MOD-DIN.

$$\text{MOD-DIN(max)} * K\text{MOD} * K\text{DAC(cal)} + \Delta FC = \Delta f\text{NBIoT}$$

where MOD-DIN is the maximum value of the modulation data input, KMOD is the loop filter varactor gain, KDAC(cal) is the calculated gain, $\Delta FC$ is the minimum frequency deviation when KDAC is zero, and $\Delta f$NBIoT is the desired frequency deviation for a specified NB-IoT frequency deviation of +/−960 kHz.

For example, the maximum change in MOD-DIN is from MOD-DIN=00 to MOD-DIN=FF, and the communication protocol specified that the frequency deviation should be +/−250 kHz, or 500 kHz total for the Bluetooth Low Energy (BLE) standard, +/−960 kHz, or 1.92 MHz total for the Narrow-Band Internet-of-Things (NB-IoT) standard, or +/−500 kHz, or 1 MHz total for the ZigBee standard.

During calibration, MOD-DIN=00 is applied to VCO 40 and a pulse count taken, then MOD-DIN=FF is applied to VCO 40, and another pulse count taken. The difference in pulse counts is CNTDIF. This is repeated for two gain values, ¼ $K_{DAC(MAX)}$ (DACGAIN(6:0)=0100000) and ¾ $K_{DAC(MAX)}$ (DACGAIN(6:0)=1100000) to obtain CNTDIF_A and CNTDIF_B.

An adjustment or calibration value is then calculated from CNTDIF_A and CNTDIF_B. This calibration value DACGAIN(6:0) is a value to be applied to offset DAC 68 that will adjust the frequencies for MOD-DIN=00 and MOD-DIN=FF to be exactly 1.0 MHz apart for ZigBee, for a +/−500 kHz specification, or 500 kHz apart for Bluetooth Low Energy (BLE), for a +/−250 kHz specification. Equation (3) below can be used to calculate DACGAIN(6:0) directly from CNTDIF_A and CNTDIF_B, when the feedback divisor and reference frequency are pre-set.

For the PLL loop, the frequency of VCO 40 is:

$$f_{VCO} = \frac{F_{ref} \cdot 2K}{N_{time}} \cdot Cnt$$

where $F_{REF}$ is the reference frequency input to phase-frequency detector 42, K is the divisor of divider 54, Cnt is the pulse count from overflow counter 56, and $N_{TIME}$ is the number of cycles of the reference frequency clock for the time period in which the counts were taken, such as the number of FREF cycles in 0.977 ms. The 2 is due to divider 63 which divides the VCO output by 2.

The frequency difference $\Delta f$ that corresponds to the difference in counts $\Delta C$, such as CNTDIF_A, is equation (1)

$$\Delta f = \frac{F_{ref} \cdot 2K}{N_{time}}(\Delta C)$$

From FIG. 6, the slope of line 77 from point 81 to point 83 is:

$$(\Delta F_A - \Delta F_B)/(\tfrac{1}{4}K_{DACMAX} - \tfrac{3}{4}K_{DACMAX})$$

and the slope of line 77 from the midpoint at $\Delta F_T$, $K_{DAC(CAL)}$ to point 83 is:

$$(\Delta F_T - \Delta F_B)/(K_{DAC(CAL)} - \tfrac{3}{4}K_{DACMAX})$$

These two slopes must be equal.

$$(\Delta F_A - \Delta F_B)/(\tfrac{1}{4}K_{DACMAX} - \tfrac{3}{4}K_{DACMAX}) = (\Delta F_T - \Delta F_B)/(K_{DAC(CAL)} - \tfrac{3}{4}K_{DACMAX})$$

After re-arranging the above equation, and solving for the calibrated DAC value $K_{DAC(MAX)}$, we obtain equation (2):

$$K_{DAC(Cal)} = \frac{\Delta f_{NBIoT} - \Delta f_A}{\Delta f_B - \Delta f_A}\left(\frac{3}{4}K_{DAC(max)} - \frac{1}{4}K_{DAC(max)}\right) + \frac{1}{4}K_{DAC(max)}$$

where $\Delta f_{NBIoT}$ is $\Delta F_T$, the frequency setting from the protocol specification.

Using the prior equation (2) for $\Delta F$ for a selected setting of $F_{REF}$, K, and cycles in the pre-set time period $N_{TIME}$, we can substitute values into the equation (1) to obtain $\Delta F_A$ as a function of $\Delta C_A$, (CNTDIF_A), and to obtain $\Delta F_B$ as a function of $\Delta C_B$, (CNTDIF_B).

For a 7-bit DAC, the maximum setting is 128, so $K_{DAC(MAX)}$ can be set to 127. When the input reference frequency $F_{REF}$ is 38.4 MHz, and K is 8, the time period can be selected as 0.977 ms, so that the number of cycles of FREF in this time period is 37500 (0.977 ms=37500*(1/38.4 MHz)). Longer calibration periods have better the accuracy but require a longer time for calibration. When the selected frequency $N_T$ is 3.84 MHz, we can solve for $K_{DAC(CAL)}$, using the prior equations to obtain equation (3):

$$K_{DAC(Cal)} = \frac{15000 - 2^6 \cdot \Delta C_A}{(\Delta C_B - \Delta C_A)} + 32$$

where $\Delta C_A$ is CNTDIF_A, and where $\Delta C_B$ is CNTDIF_B. This equation requires a multiplication by $2^6$, which is a power of 2, so this multiplication can be implemented with a shift register rather than a full multiplier. Thus solving this equation requires one divider, a shift register, and an adder/subtractor. K(DAC) calculator 64 can be greatly simplified when the values of the time period and K are selected to obtain a power-of-two in the above equation (3) for a particular frequency setting. In particular, 2*K*FREF/N is a power of 2.

In this example, for the 1.8 GHz band, a modulation frequency of +/−1.92 MHz has a total frequency difference that is double, or 3.84 MHz, so $\Delta f_T$=3.84M. When $K_{DAC}$ is set to ¼ of the maximum DAC setting of 127, or 32, the count difference $\Delta C_A$, or CNTDIF_A, would be 184 and $\Delta F_A$ would be 3.0 MHz, and when $K_{DAC}$ is set to ¾ of the maximum DAC setting of 127, or 96, the count difference $\Delta C_B$, or CNTDIF_B, would be 247 and $\Delta F_B$ would be 4.5 MHz. Then solving the above equation (3) for $K_{DAC(CAL)}$, we get 67. A value of 67 would be generated by K(DAC) calculator 64 and applied to offset DAC 68 as the calibrated DAC gain. This value of 67 would vary with temperature, process, and supply voltage from the nominal values in this example.

Other examples using the above equations for other frequency bands may be calculated by K(DAC) calculator 64, and different values of the time period and K can be pre-selected for each frequency setting.

Figure 7A:
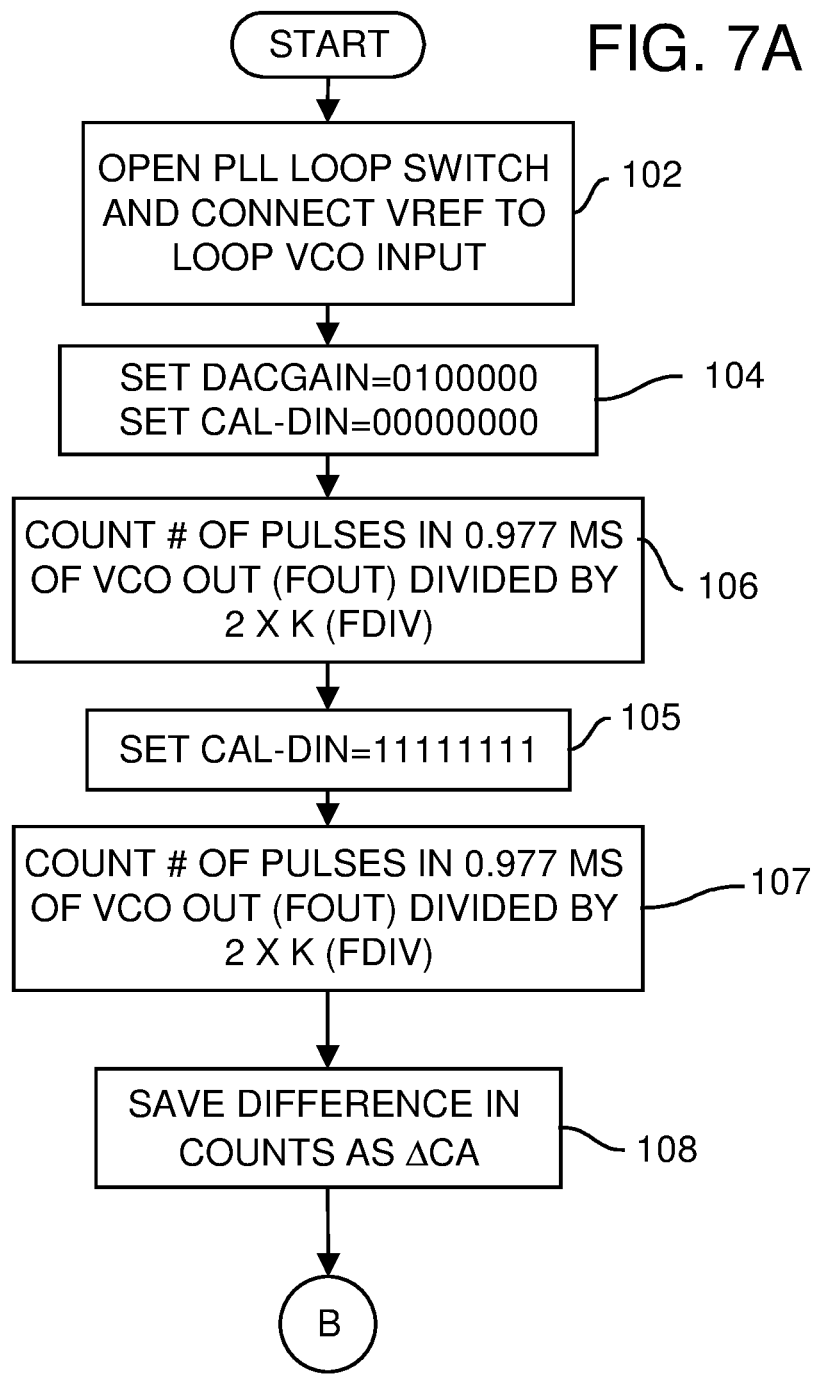
Figure 7C:
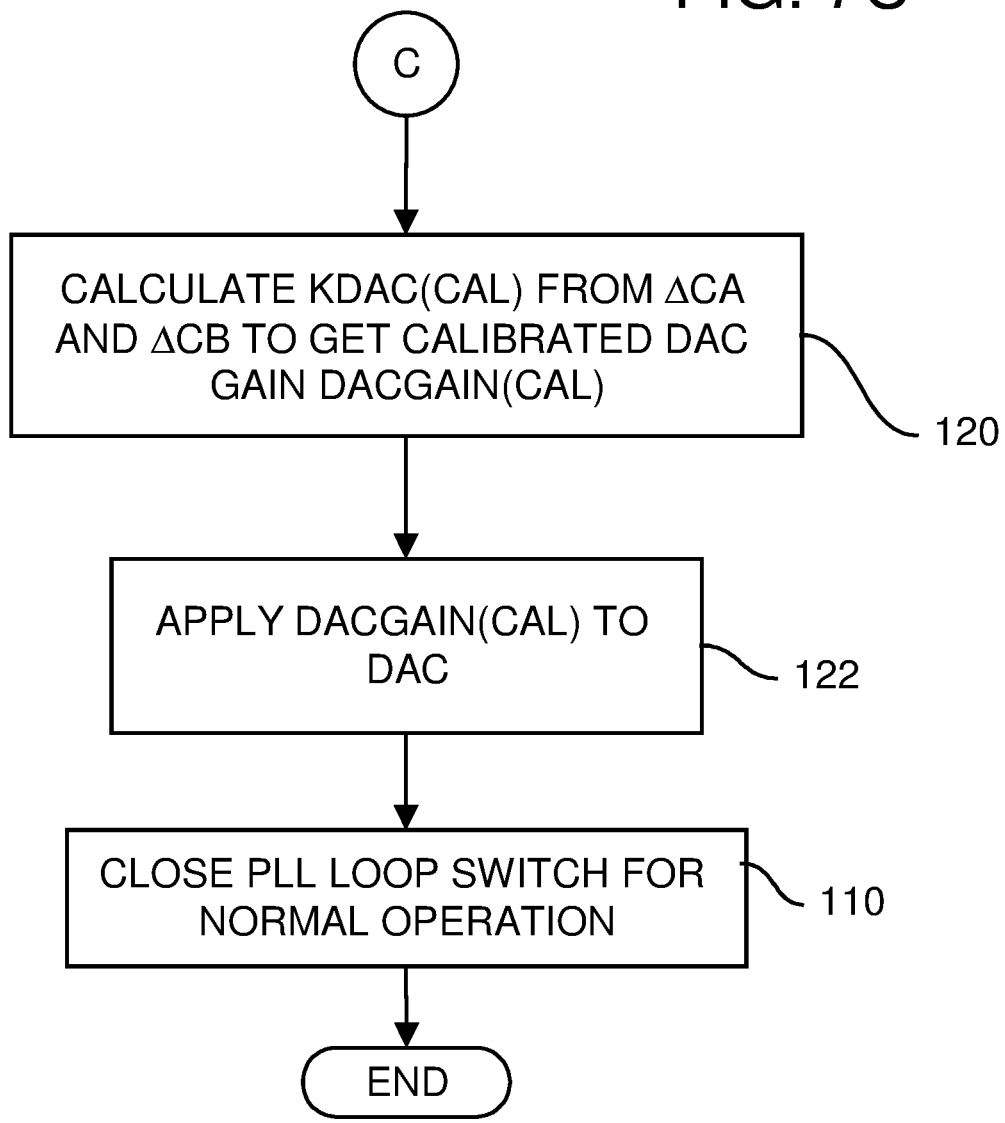

FIGS. 7A-7C show a flowchart of two-gain-point calibration of the two-point modulation PLL of FIG. 3. In FIG. 7A, switch 60 is opened to connect reference voltage VREF to the voltage input of VCO 40, opening the PLL loop, step 102.

FSM 58 sets DACGAIN(6:0) to 0100000 and sets CAL-DIN to 0000 0000, step 104. Thus the gain is set to ¼ of the maximum value, or ¼ $K_{DAC(MAX)}$. The data inputs are set to the lowest possible value. The number of pulses in a 0.977 ms period is counted by overflow counter 56 and stored, step 106. This number of pulses is FOUT divided by 2 by divider 63 and further divided by K by divider 54.

FSM 58 sets CAL-DIN to 1111 1111, step 105. Now the data inputs are set to the highest possible value. The number of pulses of (FOUT/2K) in a 0.977 ms period is counted by overflow counter 56 and stored, step 107.

The difference between the stored counts for CAL-DIN=00 and CAL-DIN=FF is calculated as $\Delta$CA, CNTDIF_A, step 108. CNTDIF_A is the difference in pulse counts when the gain is set at ¾ of the maximum setting, or ¼ $K_{DAC(MAX)}$.

In FIG. 7B, the process is repeated for a different gain value, ¾ of the maximum setting, or ¾ $K_{DAC(MAX)}$.

FSM 58 sets DACGAIN(6:0) to 1100000 and sets CAL-DIN to 0000 0000, step 114. Now the gain is set to ¾ of the maximum value, or ¾ $K_{DAC(MAX)}$. The data inputs are set to the lowest possible value. The number of pulses in a 0.977 ms period is again counted by overflow counter 56 and stored, step 116.

FSM 58 sets CAL-DIN to 1111 1111, step 115. Now the data inputs are set to the highest possible value. The number of pulses of (FOUT/2K) in a 0.977 ms period is counted again, for a fourth time, by overflow counter 56 and stored, step 117.

The difference between the stored counts for CAL-DIN=00 and CAL-DIN=FF is calculated as $\Delta$CB, CNTDIF_B, step 118. CNTDIF_B is the difference in pulse counts when the gain is set at ¾ of the maximum setting, or ¾ $K_{DAC(MAX)}$.

In FIG. 7C, K(DAC) calculator 64 receives the count differences, CNTDIF_A and CNTDIF_B, (also referred to as $\Delta$CA, $\Delta$CB), and calculates $K_{DAC(CAL)}$, using full equation (2) or simplified equation (3), step 120. The setting of DACGAIN(6:0) that corresponds to the calculated $K_{DAC(CAL)}$ is DACGAIN(CAL), which may be obtained directly as a 7-bit binary value using logic in K(DAC) calculator 64.

DACGAIN(CAL) is applied to offset DAC 68, step 122. The gain through offset DAC 68 is adjusted for calibration so that the modulated data MOD-DIN experiences the calibrated gain of offset DAC 68 as well as the fixed gain of VCO 40, $K_{MOD}$, for a total gain of $K_{DAC(CAL)} * K_{MOD}$.

Switch 60 disconnects VREF and applies the voltage from loop filter 46 to the input of VCO 40, step 110. Normal closed-loop operation can begin, using the total gain adjusted by calibration.

Alternate Embodiments

An offset DAC has been described that has a non-zero amplitude output when the DAC calibration input is set to it's minimum value, such as 0000000. A regular DAC that has zero output amplitude at a DAC calibration input of 0000000 could prevent 0000000 from ever being applied to the DAC calibration input. It is difficult to design using a regular DAC in a small gain range, due to needing to switch off the current mirror source. Small amplitude output swings from a regular DAC are most likely not useful. Using an offset DAC can enhance the resolution over a desired output swing.

While overflow counter 56 has been described as generating the count differences CNTDIF_A and CNTDIF_B, these differences could instead be calculated by K(DAC) calculator 64 and have overflow counter 56 just report the four raw counts to K(DAC) calculator 64. Alternately, overflow counter 56 could have a subtract function, such as to count down from the first count value rather than count up during the second count. Then the final value is a difference rather than the second count.

Rather than storing the CAL-DIN=FF and CAL-DIN=00 count values, FSM 58 could store only one value and then directly calculate CNTDIF. FSM 58 could also cause overflow counter 56 to count up (or down) during CAL-DIN=FF and count down (up) during CAL-DIN=00 to directly get CNTDIF once the second count period completes.

Several other embodiments are contemplated by the inventor. For example while a multi-mode divider 52 has been shown, a normal divider may be substituted, depending on the input and output frequencies needed. Sigma-delta modulator 48 may be replaced with an integer-N divider, or may be deleted in some embodiments. Switch 60 could be implemented with MOS transistor switches.

While DAC gain settings of ¾ $K_{DAC(MAX)}$, and ¼ $K_{DAC(MAX)}$ have been described, other values could be selected, such as 0.9 and 0.1×$K_{DAC(MAX)}$, or 0.6 and 0.4 times $K_{DAC(MAX)}$, etc. Also, the points 81, 83 do not have to be symmetrical around the center. Gain values such as ¾ and ⅛ times $K_{DAC(MAX)}$ could be substituted. More than two points could be used, and a line or other curve used to fit the points.

While ¾ and ¼ of the full setting $K_{DAC}$(Max) have been used, other more arbitrary calibration points A, B could be used with the more generic equation:

$$K_{DAC(Cal)} = \frac{\Delta f_{NBIoT} - \Delta f_A}{\Delta f_B - \Delta f_A}(K_{DAC(B)} - K_{DAC(A)}) + K_{DAC(A)}$$

While two gain points, at ¼ and ¾ of maximum gain have been described, three or more gain points could be tested and the best-fit line among them used.

The system may be useful for various applications and standards, such as RF sampling systems, BLE, WIFI, RFID tags, etc. The calibration gain values from K(DAC) calculator 64 may be re-calculated for different values of FREF, K, N, and for the maximum specified frequency deviation, such as 500 kHz, 1 MHz, etc. When the channel-selected carrier FCHAN changes, an indicator for the new frequency could cause K(DAC) calculator 64 to adjust for the new parameter value, such as when a frequency change occurs, such as for channel hopping.

CAL-DIN may be limited to a smaller range than calibrated for. Calibration may be performed for the full binary range of CAL-DIN=0000 0000 and CAL-DIN=1111 1111, but during normal operation, MOD-DIN may be operated within the full range. MOD-DIN and CAL-DIN may be defined in binary or in another ordering system such as two's complement. In two's complement, the minimum MOD-DIN is 1001 1001 and the maximum MOD-DIN is 0111 1111, since the first bit is a sign bit. Two's complement values may be converted to binary before input to offset DAC 68. Offset DAC 68 may have a different number of input bits and gain-calibration bits and may have its overall resolution adjusted by the number of input bits.

For example, a wireless standard could specify several frequencies that could be used, and multiple frequencies could be calibrated to allow rapid frequency hopping among these frequencies. Measurements of DACGAIN(6:0) from prior calibrations could remain stored when a new frequency is calibrated, allowing the transceiver to jump back to the old frequency and its old DACGAIN(6:0) value at a future time without requiring re-calibration.

While a variable capacitor has been described in an embodiment of a variable-gain VCO, other variable delay mechanisms could be used, such as a variable resistor, a variable filter network, muxing of delay stages, etc. The input voltage of the VCO from the loop filter could be applied to the power-supply nodes of the inverters. The number and type of inverters could be varied, and a pair of cross-coupled inverting stages, or an L-C oscillator could be used rather than three or some other odd number of inverters.

Varactors 30, 32, 34, 36 may be varicaps, varicap diodes, variable capacitance diodes, variable reactance diodes, or other devices with a reverse-biased p-n junction that has a variable width so that the size of the depletion region varies with the reverse bias. Other kinds of variable capacitors and circuits could be used. PMOS inversion mode varactors may be used. In FIG. 4, there may be many varactors 34 in parallel, of differing sizes, and a configuration setting such as CTL2(15:0) can be used to set the nominal size and capacitance value of varactor 34. Varactor 34, 36 could both be controlled by CTL2(15:0), allowing for larger changes in capacitance when he frequency band is switched. Similarly, varactors 30, 32 could have many parallel varactors, with a configuration signal CTL1(7:0) that sets the nominal capacitance. Then the analog signal from loop filter 46 varies the capacitance of varactors 30, 32 around this nominal value to adjust the capacitance and frequency output of VCO 40. Thus $K_{LOOP}$ and $K_{MOD}$ could be adjustable for different frequency band selections, allowing for a wider range of frequency bands to be supported.

While a period of time of 0.977 ms has been shown for counting pulses for calibration, other time periods could be substituted. Shorter time periods reduce calibration time but are less accurate. A longer time period allows for more accurate measurement but lengthens calibration time.

Pulse counts could be modified, such as being shifted, divided, multiplied, or their reciprocals taken, before or after storage. The count difference could be positive or negative, or could be defined as CountMod1−CountMod2 or as CountMod2−CountMod1.

Calibration could be performed multiple times per day, and triggered periodically, after a temperature change, frequency change, or by a power-up sequence.

DACGAIN(6:0) values could be reversed and inverted, or VCO 40 could require a positive-slope gain value rather than a negative-slope gain value. The VCO or other components could be adjusted for this changed definition of values.

While FSM 58 has been shown, other kinds of sequencers or controller could be used, such as hardware, firmware, or hybrid controllers. The reference voltage VREF can be a fixed voltage such as VDD/2, or can be generated using a band-gap reference, voltage divider, or other reference generator.

Additional components may be added at various nodes, such as resistors, capacitors, inductors, transistors, buffers, dividers, etc., and parasitic components may also be present. Enabling and disabling the circuit could be accomplished with additional transistors or in other ways. Pass-gate transistors or transmission gates could be added for isolation. Inversions may be added, or extra buffering. Separate power supplies and grounds may be used for some components. Various filters could be added. Active low rather than active high signals may be substituted.

Additional components may be added at various nodes for various purposes, such as cut-off switches for power-down modes, voltage shifters, offset currents to set A.C. operating points, etc. Inverters may be replaced with differential amplifiers. Various reference voltages or virtual supplies may be used rather than a hard ground.

While binary values have been described, other encodings could be substituted, such as decimal or gray code. The digital values could be in these other number systems, such as octal numbers rather than binary numbers. Values could be complemented or inverted. The number of bits may be adjusted. Various kinds of counters such as ripple counters or synchronous counters could be substituted.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. An adjustable-gain synthesizer comprising:
a phase detector that compares a reference clock to a feedback clock;
a charge pump activated by the phase detector;
a loop filter that is charged and discharged by the charge pump;
a voltage-controlled oscillator (VCO) having a loop input that determines a frequency of a VCO output, and a modulation input that modulates the frequency of the VCO output;
a switch that connects the loop filter to the loop input during a normal mode, and disconnects the loop filter and applies a reference voltage to the loop input during a calibration mode, wherein the adjustable-gain synthesizer operates in open-loop mode during the calibration mode;
a feedback divider that divides the VCO output by a divisor to generate the feedback clock;
a calibration unit having a pulse counter that receives the VCO output and generates a pulse count for a time period;
a Digital-to-Analog Converter (DAC) that receives a modulation input and a gain-calibration input, the modulation input receiving a data modulation signal, the DAC generating a signal to the modulation input of the VCO;
a controller in the calibration unit that forces the gain-calibration input of the DAC to a first DAC gain value, and forces the data modulation signal to a maximum value while the pulse counter generates a first pulse count for the time period, and forces the data modulation signal to a minimum value while the pulse counter generates a second pulse count for the time period;
the controller in the calibration unit also forcing the gain-calibration input of the DAC to a second DAC gain value, and forcing the data modulation signal to the maximum value while the pulse counter generates a third pulse count for the time period, and forcing the data modulation signal to the minimum value while the pulse counter generates a fourth pulse count for the time period; and
a K(DAC) calculator that generates a calibrated DAC gain value from the first, second, third, and fourth pulse counts;
wherein the calibrated DAC gain value is applied to the gain-calibration input of the DAC during the normal mode to adjust the modulation input of the VCO by gain compensation,
whereby calibration at two DAC gain values generates four pulse counts that determine the calibrated DAC gain value that is applied to the gain-calibration input of the DAC.

2. The adjustable-gain synthesizer of claim 1 wherein the K(DAC) calculator uses an adder, a shift register, and performs one division,
wherein two or more division operations are not performed by the calibration unit during calibration.

3. The adjustable-gain synthesizer of claim 2 wherein the K(DAC) calculator comprises a function generator that generates the calibrated DAC gain value as a function of the first, second, third, and fourth pulse counts, wherein the calibrated DAC gain value is:

$$P1-2^{P2}*[(C2-C1)/(C4-C3-C2+C1)]+P3$$

wherein:
C1 is the second pulse count;
C2 is the second pulse count;
C3 is the third pulse count;
C4 is the fourth pulse count;
FREF is a reference frequency of the reference clock in Hertz;
N is a number of cycles of FREF during the time period wherein each count is measured;
K is a divisor for the pulse counter that is 1 or more, and wherein P1, P2, and P3 are parameters determined by FREF, N, and K, such that 2*K*FREF/N is a power of 2.

4. The adjustable-gain synthesizer of claim 3 wherein the first DAC gain value is three-quarters of a range of possible values of the DAC reference value;
wherein the second DAC gain value is one-quarter of the range of possible values of the DAC reference value.

5. The adjustable-gain synthesizer of claim 1 wherein when the gain-calibration input of the DAC is set to a minimum value, the DAC has a non-zero gain from the modulation input of the DAC.

6. The adjustable-gain synthesizer of claim 5 wherein the data modulation signal has at least 12 binary bits;
wherein a gain of the loop input to the VCO is greater than a gain of the modulation input to the VCO;
wherein a linearity of the loop input to the VCO is less than a linearity of the modulation input to the VCO.

7. The adjustable-gain synthesizer of claim 5 wherein the calibrated DAC gain value, the first DAC gain value, and the second DAC gain value are each a binary word having at least 7 bits.

8. The adjustable-gain synthesizer of claim 5 wherein the pulse counter is an overflow counter that directly generates a first pulse count difference by modifying the first pulse count as the second pulse count is being generated, and that directly generates a second pulse count difference by modifying the third pulse count as the fourth pulse count is being generated, wherein the K(DAC) calculator receives pulse count differences as the first, second, third, and fourth pulse counts.

9. The adjustable-gain synthesizer of claim 3 wherein the pulse counter comprises:
a divided pulse counter;
a pre-divider that generates a pulse to the divided pulse counter after every K pulses of the VCO output, wherein K is a real number of at least 1;
whereby the VCO output is divided by K before counting.

10. The adjustable-gain synthesizer of claim 3 wherein the feedback divider is a multi-mode divider allowing for fractional divisors.

11. The adjustable-gain synthesizer of claim 10 further comprising:
a sigma-delta modulator, coupled to the feedback divider, for dithering two or more integer divisors to apply to the feedback divider.

12. The adjustable-gain synthesizer of claim 11 further comprising:

a summer, receiving the data modulation signal and a channel select signal, for generating a modulating signal to the sigma-delta modulator;

wherein data modulation is injected at the feedback divider and at the modulation input of the VCO, wherein the adjustable-gain synthesizer is a two-point modulation Phase-Locked Loop (PLL).

13. A two-point modulation Phase-Locked Loop (PLL) comprising:
a voltage-controlled oscillator (VCO) that generates a VCO output having a frequency determined by a VCO loop input and by a gain modulation input;
a feedback divider that generates a feedback clock by dividing the VCO output by a divisor, wherein the divisor is modulated by a modulating data input;
a phase comparator that compares the feedback clock to a reference clock to generate a phase-compare result;
a loop filter generating a loop voltage;
a charge pump that charges and discharges the loop filter in response to the phase-compare result;
a switch that connects the loop voltage to the VCO loop input during a normal mode of operation, and connects a reference voltage to the VCO loop input during a calibration mode;
a clock counter that receives the VCO output and generates a count difference value;
an offset Digital-to-Analog Converter (DAC) that receives the modulating data input and a DAC calibration input and generates an analog voltage to the gain modulation input of the VCO;
wherein the offset DAC has a non-zero gain offset so that the offset DAC never has a zero gain, even when the DAC calibration input is set to a minimum value;
a state machine that sets the DAC calibration input to a first test gain value, and that forces the modulating data input to a minimum state for a first measurement period of time and to a maximum state for a second measurement period of time;
wherein the clock counter counts pulses of the VCO output during the first and second measurement periods of time and generates a first count difference value as a difference in a first count during the first measurement period of time and a second count during the second measurement period of time;
wherein the state machine also sets the DAC calibration input to a second test gain value, and forces the modulating data input to the minimum state for a third measurement period of time and to the maximum state for a fourth measurement period of time;
wherein the clock counter also counts pulses of the VCO output during the third and fourth measurement periods of time and generates a second count difference value as a difference in a third count during the third measurement period of time and a fourth count during the fourth measurement period of time; and
a calibration calculator that receives the first count difference value and the second count difference value and calculates a calibration gain value;
wherein the calibration gain value is applied to the DAC calibration input of the offset DAC during the normal mode to compensate the VCO.

14. The two-point modulation PLL of claim 13 wherein the clock counter further comprises:
a fast divider that receives the VCO output and generates a divided signal having a reduced frequency than the VCO output; and
a divided clock counter that counts the divided signal from the fast divider to generate a measured count value.

15. The two-point modulation PLL of claim 14 wherein the calibration calculator further comprises:
a divider for performing one division operation;
an adder/subtractor;
a shift register for multiplying an intermediate result by a power of two.

16. The two-point modulation PLL of claim 14 wherein the calibration calculator comprises a function generator that generates the calibration gain value as a function of the first count difference value and the second count difference value, wherein the calibration gain value is:

$$P1 - 2^{P2} * (CD1)/(CD2 - CD1) + P3$$

wherein:
CD1 is the first count difference value;
CD2 is the first count difference value;
FREF is a reference frequency of the reference clock in Hertz;
N is a number of cycles of FREF for each measurement period of time;
K is a divisor for the clock counter that is 1 or more, and
wherein P1, P2, and P3 are parameters determined by FREF, N, and K, such that $2*K*FREF/N$ is a power of two.

17. The two-point modulation PLL of claim 16 wherein the first test gain value applied to the DAC calibration input during calibration is three-quarters of a range of possible values of the calibration gain value; and
wherein the second test gain value applied to the DAC calibration input during calibration is one-quarter of a range of possible values of the calibration gain value.

18. A calibrating Phase-Locked Loop (PLL) modulator comprising:
phase compare means for comparing a feedback clock to a reference clock to generate a phase-compare result;
loop filter means for generating a loop voltage;
charge pump means for charging and discharging the loop filter means in response to the phase-compare result;
switch means for connecting the loop voltage to a voltage-controlled oscillator (VCO) loop input during a normal mode of operation, and for connecting a reference voltage to the VCO loop input during a calibration mode;
feedback divider means for generating a feedback clock by dividing a VCO output by a divisor, and for modulating the divisor in response to a modulating data input;
voltage-controlled oscillator (VCO) means for generating the VCO output having a frequency determined by the VCO loop input and by a second input;
clock counter means for counting pulses of the VCO output and for generating a count difference value;
Digital-to-Analog Converter (DAC) means for generating an analog voltage to the second input of the VCO means by converting digital values of the modulating data input adjusted by a digital calibration input;
control means for applying a first test value to the digital calibration input of the DAC means and forcing the modulating data input to a minimum state for a first measurement period of time and for forcing the modulating data input to a maximum state for a second measurement period of time;
the control means also for applying a second test value to the digital calibration input of the DAC means and forcing the modulating data input to the minimum state for a third measurement period of time and for forcing the modulating data input to the maximum state for a fourth measurement period of time;

the clock counter means further for counting pulses of the VCO output:
  during the first measurement period of time to generate a first count,
  during the second measurement period of time to generate a second count,
  during the third measurement period of time to generate a third count,
  during the fourth measurement period of time to generate a fourth count; and a calibration calculator that uses the first count, the second count, the third count, an the fourth count to generate a calibration value;

wherein the calibration value is applied to the digital calibration input of the DAC means during the normal mode to compensate the VCO means.

19. The calibrating PLL modulator of claim 18 wherein the clock counter means further comprises:

fast divider means, receiving the VCO output, for generating a divided signal having a reduced frequency than the VCO output;

clock count means for counting the divided signal from the fast divider means to generate the count difference value;

wherein the DAC means has a non-zero gain offset so that the DAC means never has a zero gain, even when the digital calibration input is set to a minimum value.

20. The calibrating Phase-Locked Loop (PLL) modulator of claim 19 further comprising:

sigma-delta modulator means, coupled to the feedback divider means, for dithering two or more integer divisors to apply to the feedback divider means;

summer means, receiving the modulating data input and a channel select signal, for generating a modulating signal to the sigma-delta modulator means;

wherein data modulation is injected at the feedback divider means and at the second input of the VCO means, wherein the calibrating PLL modulator is a two-point modulation Phase-Locked Loop (PLL).

\* \* \* \* \*